(12) United States Patent
Kikuchi

(10) Patent No.: US 9,270,102 B2
(45) Date of Patent: Feb. 23, 2016

(54) MULTILAYERED BUS BAR

(71) Applicant: Ford Global Technologies, LLC, Dearborn, MI (US)

(72) Inventor: Jun Kikuchi, Novi, MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 202 days.

(21) Appl. No.: 13/953,806

(22) Filed: Jul. 30, 2013

(65) Prior Publication Data

US 2015/0035496 A1 Feb. 5, 2015

(51) Int. Cl.
*H02J 7/00* (2006.01)
*H02G 5/00* (2006.01)
*B60L 11/18* (2006.01)

(52) U.S. Cl.
CPC .............. *H02G 5/00* (2013.01); *B60L 11/1816* (2013.01)

(58) Field of Classification Search
CPC .............................. H02M 7/003; H02J 7/0029
USPC ......................................................... 320/137
See application file for complete search history.

(56) References Cited

U.S. PATENT DOCUMENTS

| | | | |
|---|---|---|---|
| 5,672,920 A | 9/1997 | Donegan et al. | |
| 6,456,516 B1* | 9/2002 | Bruckmann et al. | 363/144 |
| 6,870,253 B1 | 3/2005 | Ushijima | |
| 7,714,230 B2 | 5/2010 | Beulque | |
| 7,881,086 B2* | 2/2011 | Nakayama et al. | 363/144 |
| 2005/0094356 A1 | 5/2005 | Onizuka et al. | |
| 2007/0111089 A1* | 5/2007 | Swan | 429/160 |
| 2008/0121266 A1* | 5/2008 | Tsunomura et al. | 136/244 |
| 2009/0209494 A1* | 8/2009 | Martin et al. | 514/110 |
| 2010/0273035 A1* | 10/2010 | Kim | 429/82 |
| 2011/0006599 A1 | 1/2011 | Chemin et al. | |
| 2011/0221268 A1* | 9/2011 | Kanazawa et al. | 307/10.1 |
| 2011/0254649 A1* | 10/2011 | Hollevoet et al. | 336/200 |
| 2011/0287298 A1* | 11/2011 | Park et al. | 429/156 |
| 2013/0038152 A1* | 2/2013 | Woo et al. | 310/71 |
| 2013/0087192 A1* | 4/2013 | Kim et al. | 136/256 |
| 2013/0112239 A1* | 5/2013 | Liptac et al. | 136/246 |
| 2013/0271815 A1* | 10/2013 | Pradhan et al. | 359/275 |
| 2014/0111959 A1* | 4/2014 | Li et al. | 361/809 |
| 2014/0209344 A1* | 7/2014 | Kalayjian et al. | 174/68.2 |
| 2014/0268301 A1* | 9/2014 | Ding et al. | 359/296 |
| 2015/0022945 A1* | 1/2015 | Park et al. | 361/301.4 |
| 2015/0030915 A1* | 1/2015 | Seong et al. | 429/179 |
| 2015/0224856 A1* | 8/2015 | Snider et al. | 320/137 |
| 2015/0289391 A1* | 10/2015 | Nakatsu et al. | 320/137 |
| 2015/0303431 A1* | 10/2015 | Tiefenbach et al. | 320/137 |

FOREIGN PATENT DOCUMENTS

| | | |
|---|---|---|
| CN | 2450812 | 9/2001 |
| CN | 2018544171 | 6/2011 |
| KR | 100902482 | 6/2009 |

OTHER PUBLICATIONS

L.D. Stevanovic; Low Inductance Power Module with Blade Connector; Applied Power Electronics Conference and Exposition (APEC), Feb. 21-25, 2010 Twenty-Fifth Annual IEEE; pp. 1603-1609.

\* cited by examiner

*Primary Examiner* — Suchin Parihar

(74) *Attorney, Agent, or Firm* — Carlson, Gaskey & Olds, P.C.

(57) ABSTRACT

An example multilayered bus bar includes, among other things, a first conductive layer, a second conductive layer, and a third conductive layer. The second conductive layer is sandwiched between the first and third conductive layers. A polarity of the second conductive layer is different than a polarity of the first and third conductive layers.

21 Claims, 6 Drawing Sheets

MULTILAYERED BUS BAR

BACKGROUND

This disclosure relates generally to a bus bar and, more particularly, to a multilayered bus bar. Many electrical systems utilize bus bars. For example, electrified vehicles may include a bus bar to exchange power with a battery that stores electrical power.

Generally, electric vehicles differ from conventional motor vehicles because electric vehicles selectively drive the vehicle using one or more battery-powered electric machines. Conventional motor vehicles, by contrast, rely exclusively on an internal combustion engine to drive the vehicle. Electric vehicles may use electric machines instead of, or in addition to, to the internal combustion engine. Example electric vehicles include hybrid electric vehicles (HEV's), plug in hybrid electric vehicles (PHEV's), and battery electric vehicles (BEV's).

Referring to a prior art FIG. 1, a power train of an example prior art electric vehicle can include a power converter system utilizing at least one bus bar 200 that exchanges electricity. The prior art bus bar 200 is greatly simplified in this example. The prior art bus bar 200 has two layers. One layer is positive and the other layer is negative. In the power converter systems of electric vehicles, the prior art bus bar 200 can have a relatively high AC resistance due to the skin effect and the proximity effect associated with high frequency switching. This can lead to power loss and undesirably high thermal energy levels.

Prior art FIG. 2 shows a plot 210 associated with the prior art bus bar 200. The plot 210 shows a first trace 220a of parasitic inductance verses frequency, and a second trace 220b of parasitic resistance verses frequency for the prior art bus bar 200. The frequency range in this plot 210 is from 0 to 100 kilohertz. As known, relatively high level of parasitic inductance and parasitic resistance are typically undesirable because the parasitic resistance causes extra power losses as described in the previous paragraph and the parasitic inductance can cause voltage spikes associated with power semiconductor device switching actions and lead to relatively poor utilization of the power semiconductor device rated voltage due to a relatively large required voltage margin.

SUMMARY

A multilayered bus bar according to an exemplary aspect of the present disclosure includes, among other things, a first conductive layer, a second conductive layer, and a third conductive layer. The second conductive layer is sandwiched between the first and third conductive layers. A polarity of the second conductive layer is different than a polarity of the first and third conductive layers.

In a further non-limiting embodiment of the foregoing multilayered bus bar, the bus bar includes a first insulative layer positioned between the first and second conductive layers, and a second insulative layer positioned between the second and third conductive layers.

In a further non-limiting embodiment of any of the foregoing multilayered bus bars, the bus bar includes a conductive connection member that electrically couples the first and third conductive layers.

In a further non-limiting embodiment of any of the foregoing multilayered bus bars, the bus bar includes the first and third conductive layers each include a tab that includes an aperture to receive a first conductive connection member.

In a further non-limiting embodiment of any of the foregoing multilayered bus bars, the second conductive layer includes a tab to receive a second conductive connection member, the tabs of the first and third conductive layers on a first lateral side of the bus bar and the tab of the second conductive layer on a second lateral side of the bus bar that is opposite the first lateral side.

In a further non-limiting embodiment of any of the foregoing multilayered bus bars, the bus bar includes a first insulative layer positioned between the first and second conductive layers, an end of the first insulative layer extending, on the first lateral side, closer to the tabs of the first and third conductive layers than the second conductive layer.

In a further non-limiting embodiment of any of the foregoing multilayered bus bars, the bus bar includes a fourth conductive layer having a polarity that is the same as a polarity of the second conductive layer.

In a further non-limiting embodiment of any of the foregoing multilayered bus bars, the bus bar includes a first conductive connection member that directly electrically couples the first and third conductive layers, and a second conductive connection member that directly electrically couples the second and fourth conductive layers.

In a further non-limiting embodiment of any of the foregoing multilayered bus bars, the bus bar includes an insulative layer to electrically isolate the entire first and entire third conductive layers from the entire second conductive layer.

In a further non-limiting embodiment of any of the foregoing multilayered bus bars, the bus bar exchanges power within an electric vehicle powertrain.

In a further non-limiting embodiment of any of the foregoing multilayered bus bars, the bus bar is configured to selectively electrically couples a generator or a motor with an electric vehicle battery.

A method of exchanging power through a multilayered bus bar, according to another exemplary aspect of the present disclosure includes, among other things, exchanging electricity through a first conductive layer, a second conductive layer and a third conductive layer, and sandwiching the second conductive layer between the first and third conductive layers. The polarity of the second conductive layer is different than the polarity of the first and third conductive layers.

In a further non-limiting embodiment of the foregoing methods of exchanging power, the method includes electrically coupling the first conductive layer directly to the third conductive layer.

In a further non-limiting embodiment of any of the foregoing methods of exchanging power, the method includes charging a battery of an electric vehicle using the electricity.

In a further non-limiting embodiment of any of the foregoing methods of exchanging power, the method includes using the bus bar to selectively exchange power from a motor or a generator to a battery.

In a further non-limiting embodiment of any of the foregoing methods of exchanging power, the method includes sandwiching the third conductive layer between the second conductive layer between a fourth conductive layer. The polarity of the second conductive layer is the same as the polarity of the fourth conductive layer.

In a further non-limiting embodiment of any of the foregoing methods of exchanging power, the method includes electrically coupling the second conductive layer directly to the fourth conductive layer.

In a further non-limiting embodiment of any of the foregoing methods of exchanging power, the method includes electrically isolating the second conductive layer from both the first and third conductive layers.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 3:
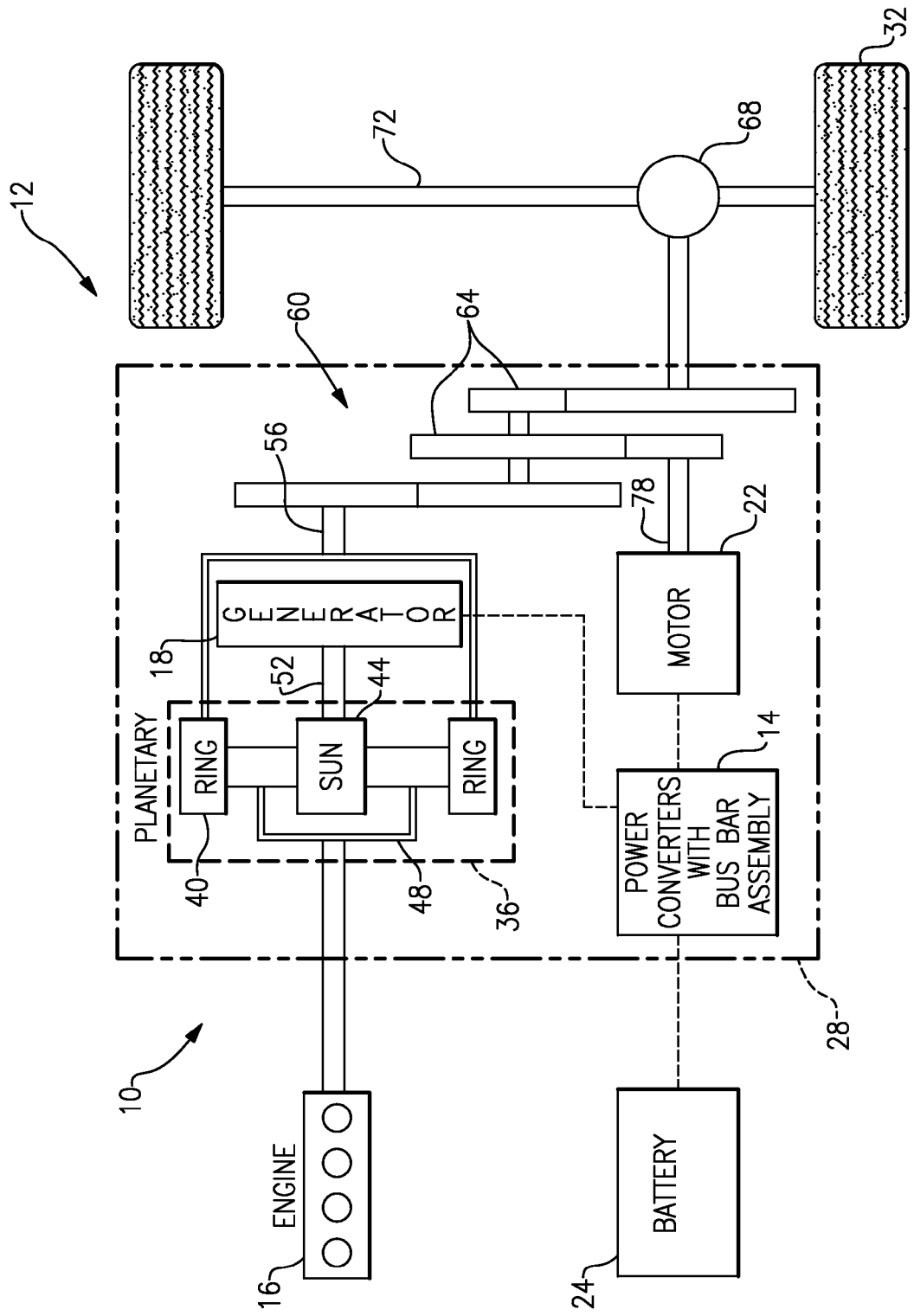
FIG. 3 illustrates a schematic view of example electric vehicle powertrain.

Referring to FIG. 3, a powertrain 10 for an electric vehicle 12 includes a block of power converters with bus bar assembly 14 that selectively exchanges power. Although the power converters with bus bar assembly 14 is depicted as being used in connection with a powertrain for a hybrid electric vehicle (HEV), it should be understood that the concepts described herein are not limited to HEV's and could extend to other electric vehicles, including but not limited to, plug-in hybrid electric vehicles (PHEV's) and battery electric vehicles (BEV's).

In other examples, the power converters with bus bar assembly 14 could be used in electrical systems other than vehicle electrical systems, such as electrical systems for buildings.

In one embodiment, the powertrain 10 is a powersplit powertrain system that employs a first drive system and a second drive system. The first drive system includes a combination of an engine 16 and a generator 18 (i.e., a first electric machine). The second drive system includes at least a motor 22 (i.e., a second electric machine), the generator 18, and a battery 24. In this example, the second drive system is considered an electric drive system 28 of the powertrain 10. The first and second drive systems generate torque to drive one or more sets of vehicle drive wheels 32 of the electric vehicle 12.

The engine 16, which is an internal combustion engine in this example, and the generator 18 may be connected through a power transfer unit 36, such as a planetary gear set. Other types of power transfer units, including other gear sets and transmissions, could be used to connect the engine 16 to the generator 18. In one non-limiting embodiment, the power transfer unit 36 is a planetary gear set that includes a ring gear 40, a sun gear 44, and a carrier assembly 48.

The generator 18 may be driven by the engine 16 through the power transfer unit 36 to convert kinetic energy to electrical energy. The generator 18 can alternatively function as a motor to convert electrical energy into kinetic energy, thereby outputting torque to a shaft 52 connected to the power transfer unit 36. Because the generator 18 is operatively connected to the engine 16, the speed of the engine 16 can be controlled by the generator 18.

The ring gear 40 of the power transfer unit 36 may be connected to a shaft 56, which is connected to vehicle drive wheels 32 through a second power transfer unit 60. The second power transfer unit 60 may include a gear set having a plurality of gears 64. Other power transfer units may also be suitable. The gears 64 transfer torque from the engine 16 to a differential 68 to ultimately provide traction to the vehicle drive wheels 32. The differential 68 may include a plurality of gears that enable the transfer of torque to the vehicle drive wheels 32. The second power transfer unit 60 is mechanically coupled to an axle 72 through the differential 68 to distribute torque to the vehicle drive wheels 32.

The motor 22 (i.e., a second electric machine) can also be employed to drive the vehicle drive wheels 32 by outputting torque to a shaft 78 that is also connected to the second power transfer unit 60. In one embodiment, the motor 22 and the generator 18 cooperate as part of a regenerative braking system in which both the motor 22 and the generator 18 can be employed as motors to output torque. For example, the motor 22 and the generator 18 can each output electrical power through the power converters with bus bar assembly 14 to the battery 24. The battery 24 may be a high voltage battery that is capable of outputting electrical power to operate the motor 22 and the generator 18. Other types of energy storage devices and/or output devices can also be used with the electric vehicle 12.

Figure 4:
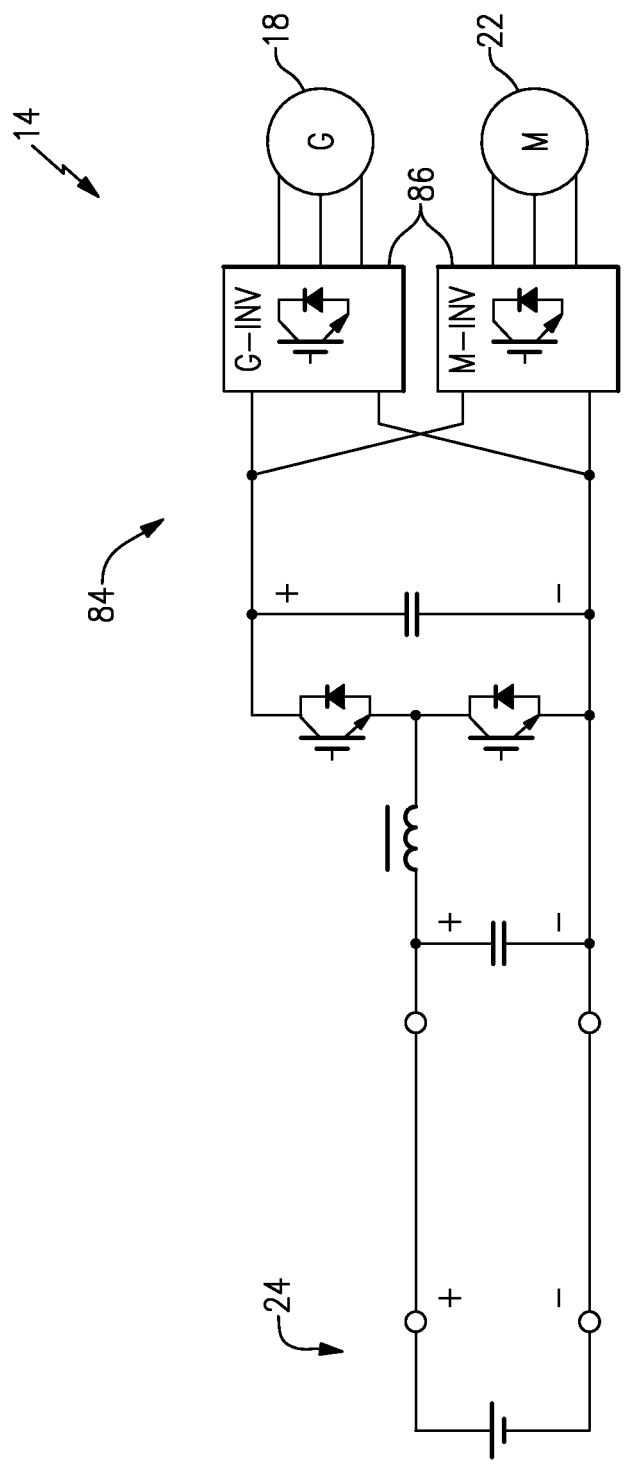
FIG. 4 illustrates a more detailed schematic view of a bus bar area within the powertrain of FIG. 3.

Referring now to FIG. 4 with continuing reference to FIG. 3, the power converters with bus bar assembly 14 includes a high-voltage bus bar 84 used when selectively electrically coupling the generator 18 or the motor 22 to the battery 24. The example bus bar 84 is coupled to one or more converters 86 to exchange appropriate power to and from the battery 24. The power converter with bus bar assembly 14 could also be used to transfer electrical power between the motor 22 and generator 18 without involving the battery 24. Example converters 86 include an AC/DC converter, a DC/DC converter, etc.

Figure 5:
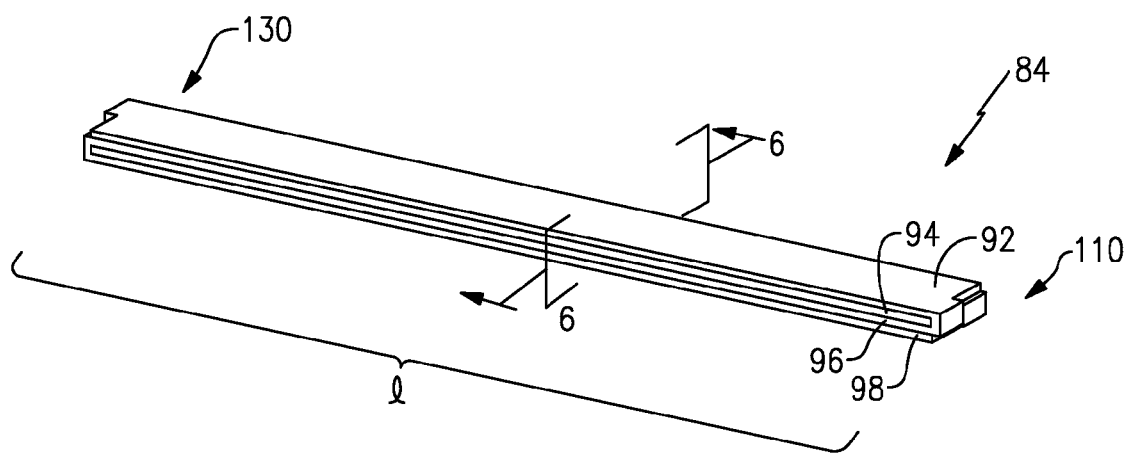
FIG. 5 illustrates a bus bar for use in the powertrain of FIG. 3.
Figure 6:
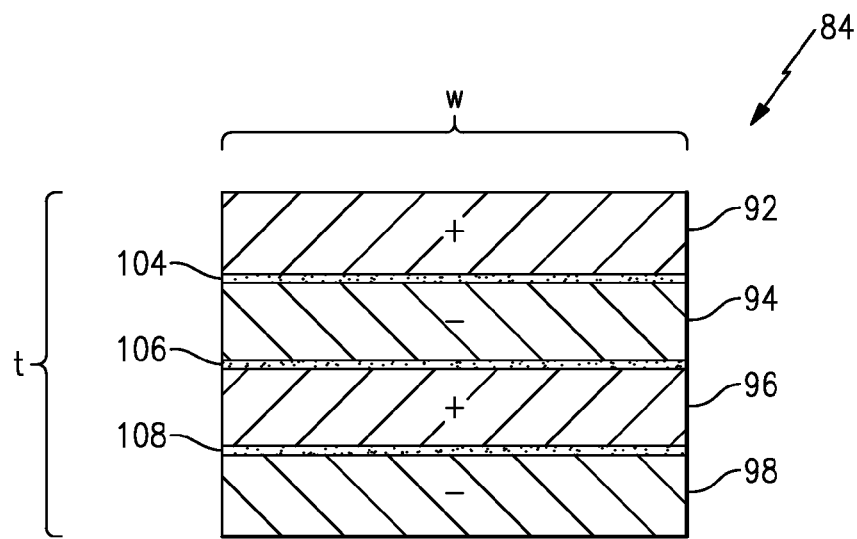
FIG. 6 shows a section view at line 6-6 in FIG. 5.
Figure 7:
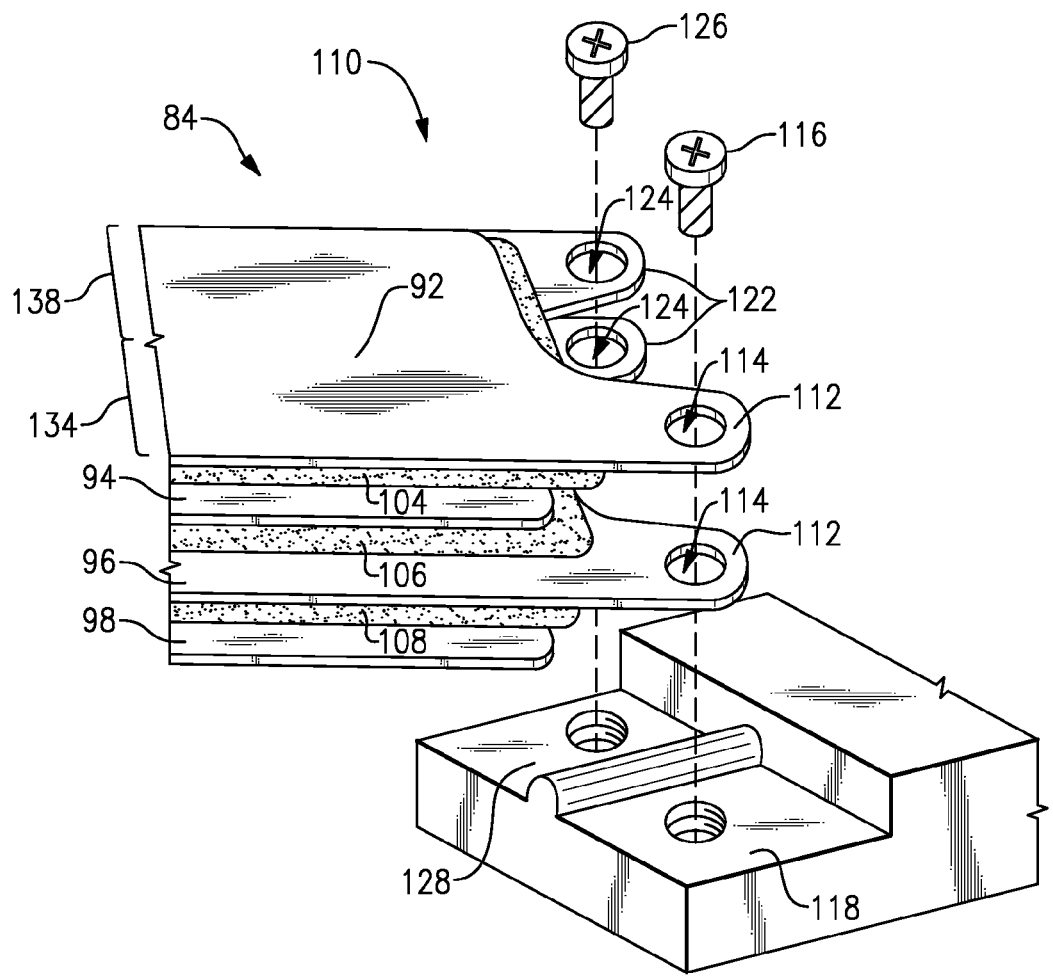
FIG. 7 shows an exploded view of an end of the bus bar of FIG. 5 and a terminal.

Referring now to FIGS. 5-7, the example bus bar 84 is multilayered and includes a first conductive layer 92, a second conductive layer 94, a third conductive layer 96, and a fourth conductive layer 98.

The polarity of the first conductive layer 92 is the same as the polarity of the third conductive layer 96. In this example, both the first and third conductive layers 92 and 96 are positive. The polarity of the second conductive layer 94 is also the same as the polarity of the fourth conductive layer 98. In this example, both the second and fourth conductive layers 94 and 98 are negative. Thus, in this example, the polarity of the first and third conductive layers 92 and 96 is different than the polarity of the second and fourth conductive layers 94 and 98, and the example bus bar 84 includes more than one conductive layer having the same polarity.

The example bus bar 84 includes four total layers. As can be appreciated, the negative conductive layer 94 is sandwiched between the positive conductive layers 92 and 96, and the positive conductive layer 96 is sandwiched between the negative conductive layers 94 and 98.

Rather than four total conductive layers, other examples may include three total conductive layers where two of the conductive layers are positive and one conductive layer negative, or vice versa. Still other examples may include more than four conductive layers.

A first insulative layer 104 is positioned between the first and second conductive layers 92 and 94. A second insulative layer 106 is positioned between the second and third conductive layers 94 and 96. A third insulative layer 108 is positioned between the third and fourth conductive layers 96 and 98. The insulative layers 104, 106, and 108 can be paper, Nomex®, or some other insulative material.

At a first end 110 of the bus bar 84, tabs 112 extend from the first and third conductive layers 92 and 96. The tabs 112 each include an aperture 114. A first connection member 116 extends through the apertures 114 and is secured to a first positive terminal 118. The connection member 116 electrically couples the first and third conductive layers 92 and 96 to each other and to the first positive terminal 118.

Also, at the first end 110, tabs 122 extend from the second and fourth conductive layers 94 and 98. The tabs 122 each include an aperture 124. A second connection member 126 extends through the apertures 124 and is secured to a first negative terminal 128. The connection member 126 electrically couples the second and fourth conductive layers 94 and 98 to each other, and to the first negative terminal 128. The first and second connection members 116 and 126 are threaded connection members, such as a bolts, in this example. The first and second connection members 116 and 126 can be conductive or nonconductive.

The first positive terminal 118 and first negative terminal 128 provide a power converter terminal in this example, such as one of the converters 86 (FIG. 4).

At a second end 130 of the bus bar 84, opposite the first end 110, the first and third conductive layers 92 and 96 may include tabs (not shown) that are secured to a second positive terminal. Also at the second end 130 of the bus bar 84, the second and fourth conductive layers 94 and 98 are secured to a second negative terminal. The second negative terminal and second positive terminal provide a capacitor terminal in this example.

The tabs 112 are on one lateral side 134 of the bus bar 84. The tabs 122 are on an opposite lateral side 138 of the bus bar 84. On the lateral side 134, the insulative layers 104, 106, 108 extend closer to the tabs 112 than the second and fourth conductive layers 94 and 98. On the lateral side 138, the insulative layers 104, 106, 108, extend closer to the tabs 122 than the first and third conductive layers 92 and 96. This positioning helps to ensure than the first and third conductive layers 92 and 96 remain electrically isolated from the second and fourth conductive layers 94 and 98 even in near the tabs 112 and 122.

Figure 1:
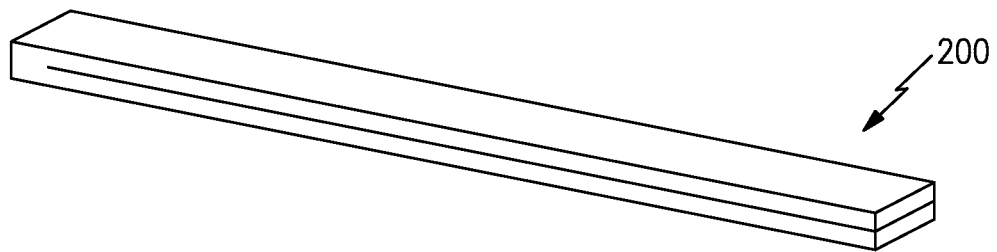
FIG. 1 illustrates a simplified example model of prior art bus bar.

In the example bus bar 84, the insulative layers 104, 106, 108, space adjacent ones of the conductive layers 92, 94, 96, 98, about 0.2 millimeters from each other. A thickness t of the example bus bar 84 is about 4 millimeters. Also, the bus bar 84 has a length l and width w that are about 20 centimeters and about 20 millimeters respectively. Notably, the length and width and total thickness of the bus bar 84 are approximately the same as the prior art bus bar 200 (FIG. 1), yet the thickness of the conductive each layers 92, 94, 96, 98, are thinner than the conductive layers in the prior art bus bar 200 with the same total cross-sectional area. Since the bus bar 84 and the prior art bus bar 200 are about the same overall size, no significantly different packaging space is required to accommodate the bus bar 84 rather than the prior art bus bar 200.

Figure 2:
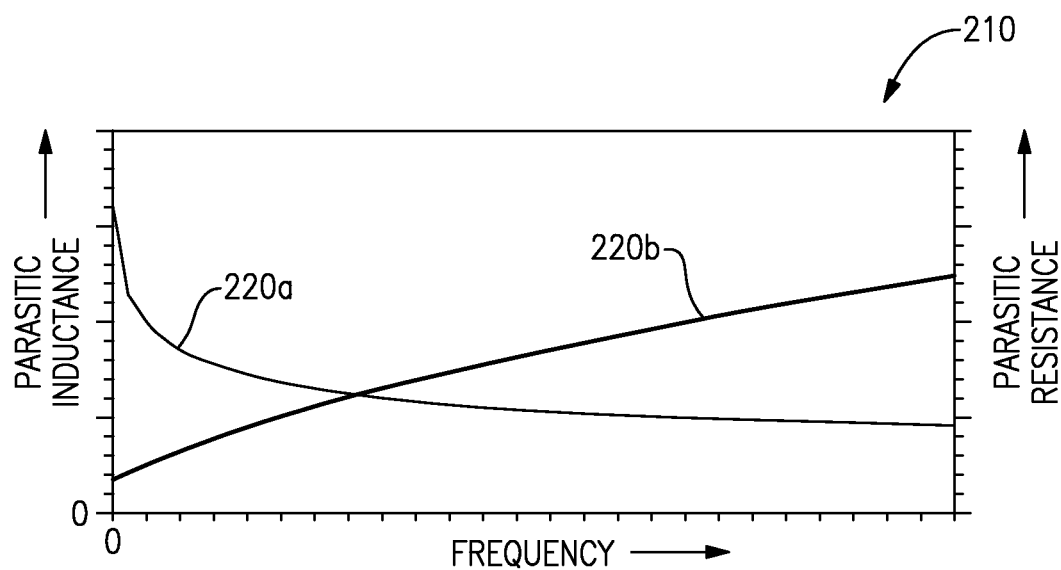
FIG. 2 illustrates a frequency plot associated with the simplified prior art bus bar of FIG. 1.
Figure 8:
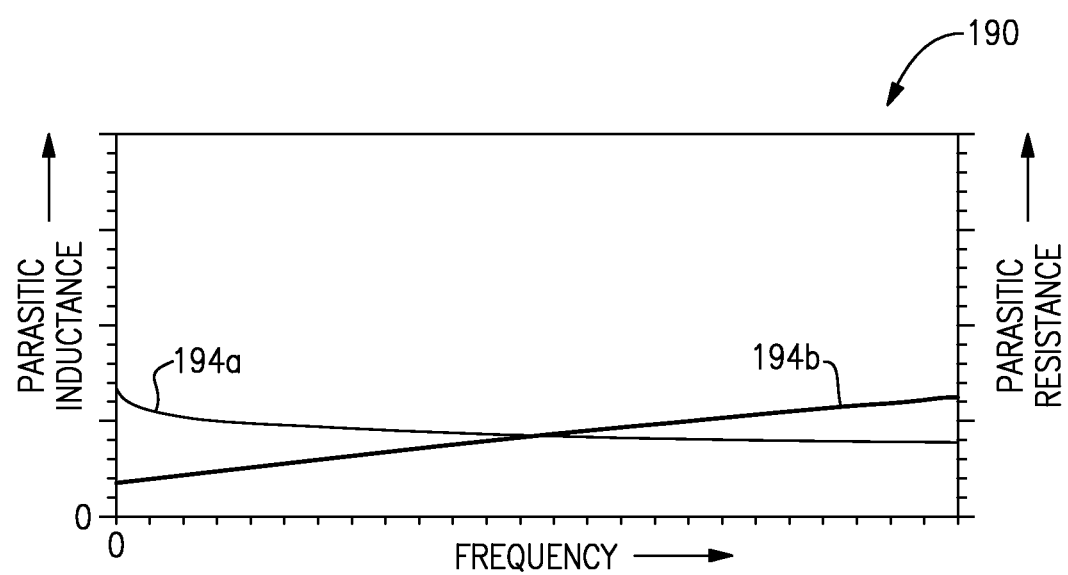
FIG. 8 illustrates a frequency plot associated with the bus bar of FIG. 5.

As shown in a comparison of a plot 190 of FIG. 8 to the plot 210 in prior art FIG. 2, the example bus bar 84, due at least in part to its multilayered structure, provides a reduction in parasitic resistance versus the prior art bus bar 200. The plot 190 shows an example first trace 194a of parasitic inductance verses frequency, and a second trace 194b of parasitic resistance verses frequency for the example bus bar 84. The frequency range in the plot 190 is from 0 to 100 kilohertz. The frequency range of the plot 190 thus represents the same frequency range of the plot 210 in prior art FIG. 2. The ranges of the vertical axes are also the same in the plot 190 as in the plot 210 in prior art FIG. 2.

Reductions in parasitic resistance may be desirable to reduce power loss and lower temperature rises. The multilayered structure also facilitates reductions in parasitic inductance due to tighter magnetic coupling between the positive and negative layers. Because of this reduced parasitic inductance, the bus bar 84 may have a reduction in required voltage margin for the power-semiconductor devices in use due to the voltage spike reduction compared to the prior art bus bar 200.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments. Further, unless otherwise specified, the steps may be performed in any order.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

I claim:

1. A multilayered bus bar, comprising:
a first conductive layer of a direct current bus bar;
a second conductive layer of the direct current bus bar; and
a third conductive layer of the direct current bus bar, wherein the second conductive layer is sandwiched between the first and third conductive layers, and a polarity of the second conductive layer is different than a polarity of the first and third conductive layers, wherein a first end of the first and third conductive layers are configured to couple to a first terminal, and a second end of the first and third conductive layers are configured to couple to a second terminal.

2. The multilayered bus bar of claim 1, including a first insulative layer positioned between the first and second conductive layers, and a second insulative layer positioned between the second and third conductive layers.

3. The multilayered bus bar of claim 1, including a conductive connection member that electrically couples the first and third conductive layers.

4. The multilayered bus bar of claim 1, wherein the first and third conductive layers each include a tab that includes an aperture to receive a first conductive connection member.

5. The multilayered bus bar of claim 4, wherein the second conductive layer includes a tab to receive a second conductive connection member, the tabs of the first and third conductive layers on a first lateral side of the bus bar and the tab of the second conductive layer on a second lateral side of the bus bar that is opposite the first lateral side.

6. The multilayered bus bar of claim 5, including a first insulative layer positioned between the first and second conductive layers, an end of the first insulative layer extending, on the first lateral side, closer to the tabs of the first and third conductive layers than the second conductive layer.

7. The multilayered bus bar of claim 1, including a fourth conductive layer having a polarity that is the same as a polarity of the second conductive layer.

8. The multilayered bus bar of claim 7, including a first conductive connection member that directly electrically couples the first and third conductive layers, and a second conductive connection member that directly electrically couples the second and fourth conductive layers.

9. The multilayered bus bar of claim 1, including an insulative layer to electrically isolate the entire first and entire third conductive layers from the entire second conductive layer.

10. The multilayered bus bar of claim 1, wherein the bus bar exchanges power within an electric vehicle powertrain.

11. The multilayered bus bar of claim 10, wherein the bus bar is configured to selectively electrically couples a generator or a motor with an electric vehicle battery.

12. A method of exchanging power through a multilayered bus bar, comprising:
exchanging electricity through a first conductive layer of a direct current bus bar, a second conductive layer of the direct current bus bar, and a third conductive layer of the direct current bus bar; and
sandwiching the second conductive layer between the first and third conductive layers, wherein the polarity of the second conductive layer is different than the polarity of the first and third conductive layers, wherein a first end of the first and third conductive layers are configured to couple to a first terminal, and a second end of the first and third conductive layers are configured to couple to a second terminal.

13. The method of claim 12, including electrically coupling the first conductive layer directly to the third conductive layer.

14. The method of claim 12, including charging a battery of an electric vehicle using the electricity.

15. The method of claim 12, using the bus bar to selectively exchange power from a motor or a generator to a battery.

16. The method of claim 12, including sandwiching the third conductive layer between the second conductive layer and a fourth conductive layer of the direct current bus bar, the polarity of the second conductive layer being the same as the polarity of the fourth conductive layer.

17. The method of claim 16, including electrically coupling the second conductive layer directly to the fourth conductive layer.

18. The method of claim 12, including electrically isolating the second conductive layer from both the first and third conductive layers.

19. The method of claim 12, further comprising exchanging electricity from a positive terminal and a negative terminal through the first conductive layer, the second conductive layer, and the third conductive layer.

20. A multilayered bus bar, comprising:
a first conductive layer;
a second conductive layer; and
a third conductive layer, wherein the first and third conductive layers are each configured to attach to a common first terminal and a common second terminal, wherein the second conductive layer is sandwiched between the first and third conductive layers, and a polarity of the second conductive layer is different than a polarity of the first and third conductive layers.

21. The multilayered bus bar of claim 20 wherein the first, second, and third conductive layers are layers of a direct current bus bar, wherein a first conductive connection member directly electrically couples a first end of the first and third conductive layers to each other and to the common first terminal, wherein a second conductive connection member directly electrically couples an opposing, second end of the first and third conductive layers to each other and to the common second terminal.

* * * * *